(12) United States Patent
Evans

(10) Patent No.: US 6,575,762 B2
(45) Date of Patent: Jun. 10, 2003

(54) CONNECTION OF COAXIAL CABLE TO A CIRCUIT BOARD

(75) Inventor: Robert F. Evans, Bedford, NH (US)

(73) Assignee: FCI Americas Technology, Inc., Reno, NV (US)

( * ) Notice: Subject to any disclaimer, the term of this patent is extended or adjusted under 35 U.S.C. 154(b) by 81 days.

(21) Appl. No.: 09/953,773

(22) Filed: Sep. 17, 2001

(65) Prior Publication Data

US 2003/0054674 A1 Mar. 20, 2003

(51) Int. Cl.[7] ............................................. H01R 12/00
(52) U.S. Cl. ........................................................ 439/63
(58) Field of Search ................... 439/63, 581; 333/260, 333/33

(56) References Cited

U.S. PATENT DOCUMENTS

| | | | | |
|---|---|---|---|---|
| 5,044,963 A | * | 9/1991 | Kukkonen et al. ........... 333/260 |
| 5,402,315 A | | 3/1995 | Reichle ....................... 361/784 |
| 5,532,659 A | * | 7/1996 | Dodart ........................ 333/260 |
| 5,861,787 A | | 1/1999 | Graeber ....................... 335/154 |
| 5,865,654 A | | 2/1999 | Shimirak et al. ........... 439/852 |
| 5,961,348 A | | 10/1999 | Murphy ....................... 439/579 |
| 6,030,231 A | * | 2/2000 | Sarkiniemi ................... 439/101 |
| 6,053,744 A | | 4/2000 | Gray et al. .................... 439/63 |
| 6,077,087 A | | 6/2000 | Endres et al. ................. 439/63 |
| 6,094,352 A | | 7/2000 | Reddy et al. ................ 361/753 |
| 6,123,550 A | * | 9/2000 | Burkert et al. .............. 439/581 |
| 6,137,064 A | | 10/2000 | Kiani et al. .................. 174/266 |

* cited by examiner

Primary Examiner—Neil Abrams
Assistant Examiner—Phuong Dinh
(74) Attorney, Agent, or Firm—Woodcock Washburn LLP

(57) ABSTRACT

A coaxial cable to circuit board connection is provided that has reduced return losses. An apparatus for connecting the coaxial cable to the circuit board includes a tube and an extension member. The tube secures the coaxial cable such that an inner conductor of the coaxial cable may be directly connected to the circuit board. The extension member is connected approximately longitudinally along the tube and extending approximately radially outward from the tube such that an outer conductor of the coaxial cable may be connected to the circuit board.

26 Claims, 6 Drawing Sheets

CONNECTION OF COAXIAL CABLE TO A CIRCUIT BOARD

FIELD OF THE INVENTION

The invention relates to electrical connectors, and more particularly, to connection of a coaxial cable to a circuit board.

BACKGROUND OF THE INVENTION

Wiring systems are often used to transmit information from one electronic system to another electronic system. For example, information is transmitted from one phone to another phone during a phone call, from a cable television provider to a multiple televisions, from a computer processor to a video display terminal, and the like.

The use of coaxial cable has become more prevalent in communications and other systems because of its advantages over two-wire systems, such as having a higher bandwidth. That is, coaxial cable can be used to transmit information at higher speeds than with a two-wire system. Often, wiring systems are terminated at a piece of electronic equipment for processing of the transmitted signal. The connections to terminate the wiring at the electronic equipment can degrade the quality of the signal, thereby causing errors or limiting the speed of information transmission. Each connection has some return loss associated with the connection and the return loss may vary with the quality of the connection. Therefore, to reduce return losses, the number of connections should be reduced and the connections should be high quality connections.

Numerous systems and methods for connecting a two-wire wiring system to electronic equipment are known. Connecting a coaxial cable to a printed circuit board with reduced return losses, however, can be challenging. Existing systems and methods for connecting a coaxial cable to a printed circuit board do not sufficiently reduce return losses to acceptable levels in many circumstances.

Therefore, a need exists for a system and method for connecting a coaxial cable to a circuit board, the connection having relatively reduced return losses.

SUMMARY OF THE INVENTION

The invention is directed to connecting a coaxial cable to a circuit board, wherein the connection has relatively reduced return losses.

An apparatus is provided for connecting the coaxial cable to the circuit board. The apparatus includes a tube and an extension member. The tube secures the coaxial cable such that an inner conductor of the coaxial cable may be directly connected to the circuit board. The extension member is connected approximately longitudinally along the tube and extending approximately radially outward from the tube such that an outer conductor of the coaxial cable may be coupled to the circuit board.

A circuit board is provided for connecting the coaxial cable to the circuit board. The circuit board comprises a substantially planar substrate having a void, a first electrical contact surface located in the substrate and located along a first side of the void, and a second electrical contact surface located in the substrate and located along a second side of the void. The void receives a portion of the coaxial cable.

A system is provided for connecting a coaxial cable comprising an inner conductor and an outer conductor to electronic equipment. The system comprises a circuit board and an apparatus as described above.

A method is provided for connecting a coaxial cable to a circuit board. The coaxial cable comprises an inner conductor and an outer conductor. The method comprises placing an end of the coaxial cable, including the outer conductor, into an attachment mechanism, connecting the attachment mechanism to the circuit board, and connecting the inner conductor directly to the circuit board.

The above-listed features, as well as other features, of the invention will be more fully set forth hereinafter.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the several views of the drawings, and wherein.

DETAILED DESCRIPTION OF THE ILLUSTRATIVE EMBODIMENTS

Figure 1:
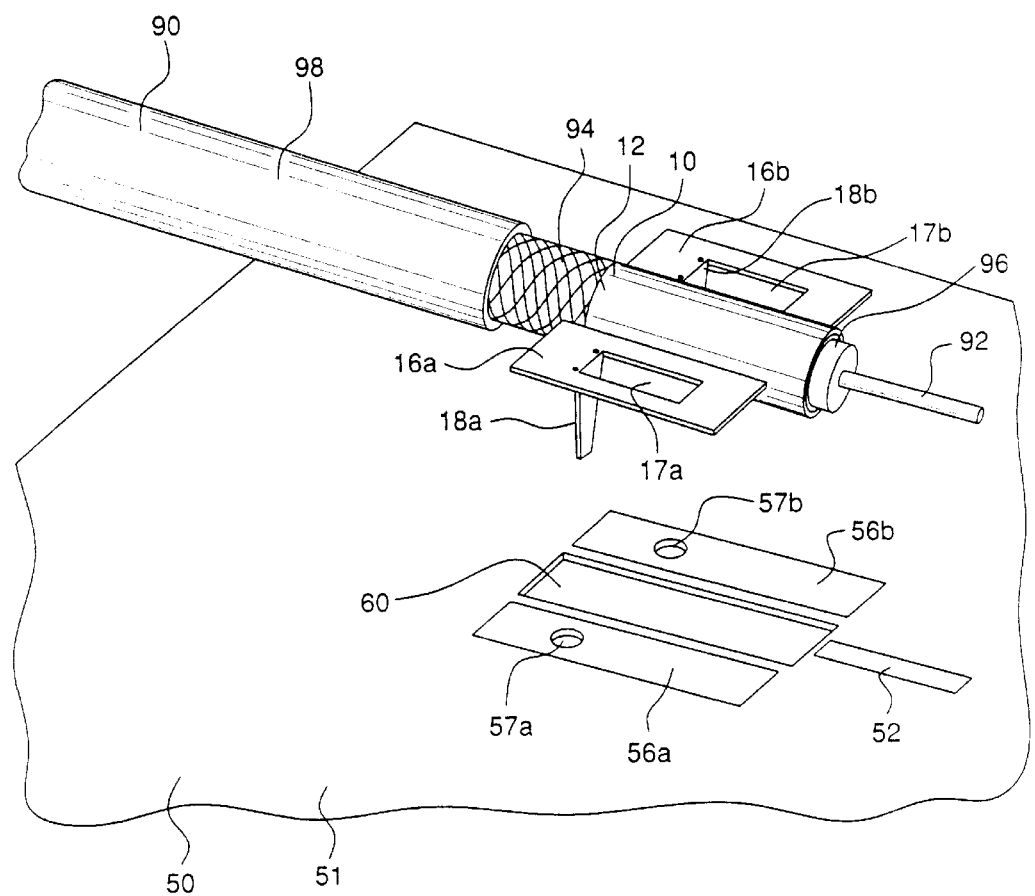
FIG. 1 is a perspective view of an exemplary coaxial cable with which the invention may be employed, and an illustrative printed circuit board and an illustrative apparatus for connecting the coaxial cable to the printed circuit board, in accordance with an embodiment of the invention.

Certain terminology may be used in the following description for convenience only and is not considered to be limiting. For example, the words "left", "right", "upper", and "lower" designate directions in the drawings to which reference is made. Likewise, the words "inwardly" and "outwardly" are directions toward and away from, respectively, the geometric center of the referenced object. The terminology includes the words above specifically mentioned, derivatives thereof, and words of similar import.

The invention is directed to connecting a coaxial cable to a circuit board, wherein the connection has relatively reduced return losses.

Referring to the drawings in detail, there is shown in FIG. 1 a perspective view of an exemplary coaxial cable with which the invention may be employed, and an illustrative printed circuit board and an illustrative apparatus for connecting the coaxial cable to the printed circuit board. As shown in FIG. 1, apparatus 10 is used to electrically and mechanically connect coaxial cable 90 to printed circuit board 50.

Coaxial cable 90 conventionally comprises, from inner most to outer most, an inner conductor 92, a first insulation layer 96, an outer conductor 94, and a second insulation layer 98. Inner conductor 92 typically carries the signal and outer conductor 92 typically acts as an electrical shield and return path to the inner conductor 92. A portion of coaxial cable 90 is stripped of its insulation to expose inner conductor 92 and outer conductor 94 for electrical connection of such conductors to circuit board 50.

Apparatus 10 comprises a tube 12, a first extension member 16a, and a second extension member 16b.

Tube 12 is cylindrically shaped and is adapted to receive coaxial cable 90. In particular, tube 12 is adapted to receive inner conductor 92, first insulation layer 96, and outer conductor 94 into tube 12 such that the inner wall of tube 12 electrically contacts outer conductor 94. The invention encompasses any type of electrical and/or mechanical coupling of tube 12 and coaxial cable 90 including for example, a press fit or an interference fit. As such, outer conductor 94 may be electrically connected to circuit board 50. It is contemplated that tube 12 may be any shape that contacts outer conductor 94 and can be connected to circuit board 50, such as for example, a u-shaped bracket, and the like. Further, tube 12 may be tapered to allow easy placement of coaxial cable 90 into a large end of tube 12 and to allow electrical contact between outer conductor 94 and the inner wall of a small end of tube 12.

Figure 3:
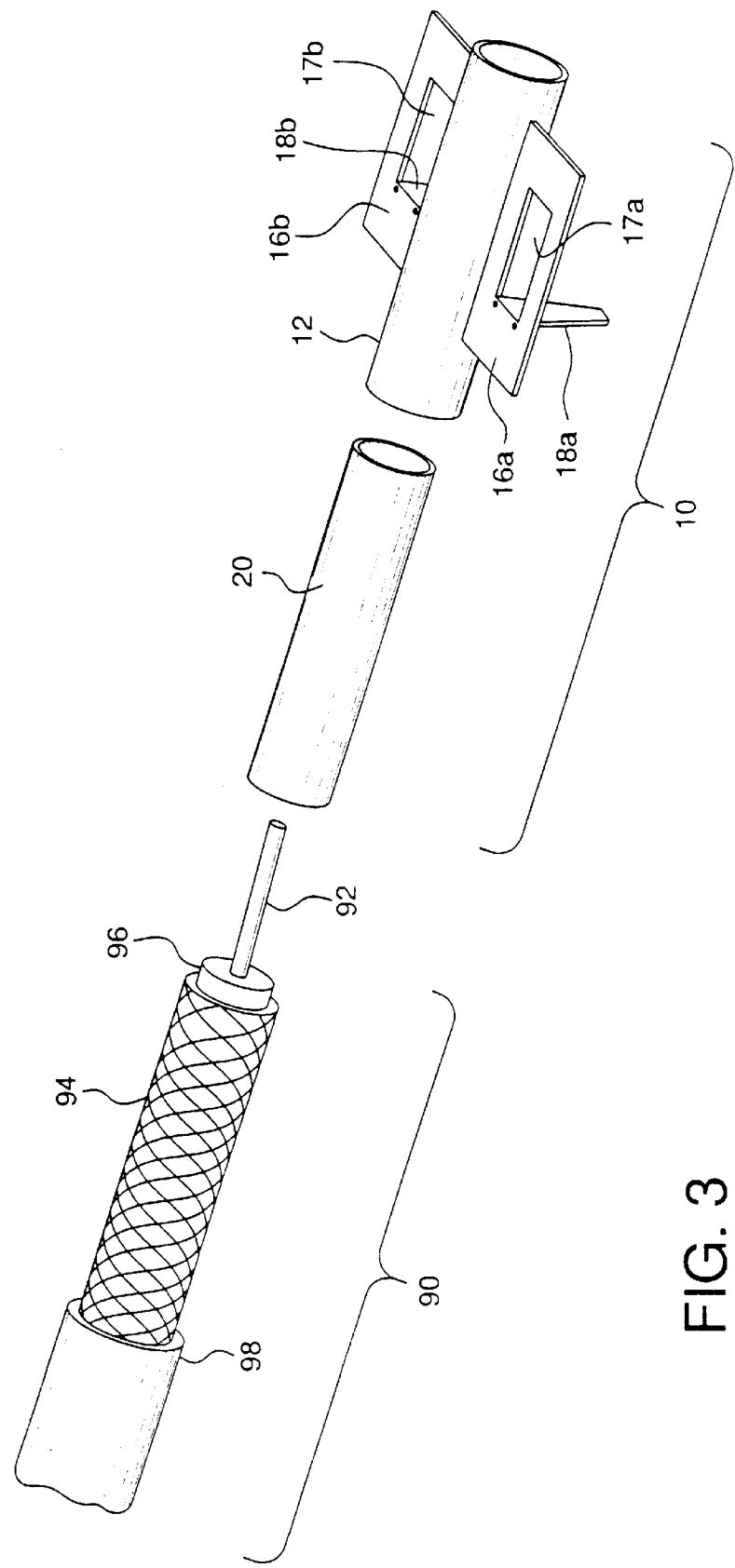
FIG. 3 is an exploded perspective view of the exemplary coaxial cable and illustrative apparatus of FIGS. 1 and 2, in accordance with an embodiment of the invention.

Apparatus 10 may also include second tube 20, such as can be seen in FIG. 3, which is an exploded perspective view of apparatus 10 and coaxial cable 90. Second tube 20 is conductive, cylindrically shaped, adapted to receive coaxial cable 90, and adapted to be received in tube 12. Second tube 20 may be used to provide hoop strength for placement of coaxial cable 90 (and second tube 20) into tube 12.

Referring back to FIG. 1, first extension member 16a is substantially planar, is connected approximately longitudinally along tube 12, and extends approximately radially outward from tube 12. Second extension member 16b is substantially planar, is connected approximately longitudinally along tube 12, and extends approximately radially outward from tube 12 approximately opposite from first extension member 16a. Thus, first extension member 16a and second extension member 16b are substantially coplanar. While two extension members are shown, it is contemplated that there may be only one or three or more extension members and that the extension members may take any shape that allows apparatus 10 to be connected to circuit board 50.

Figure 4:
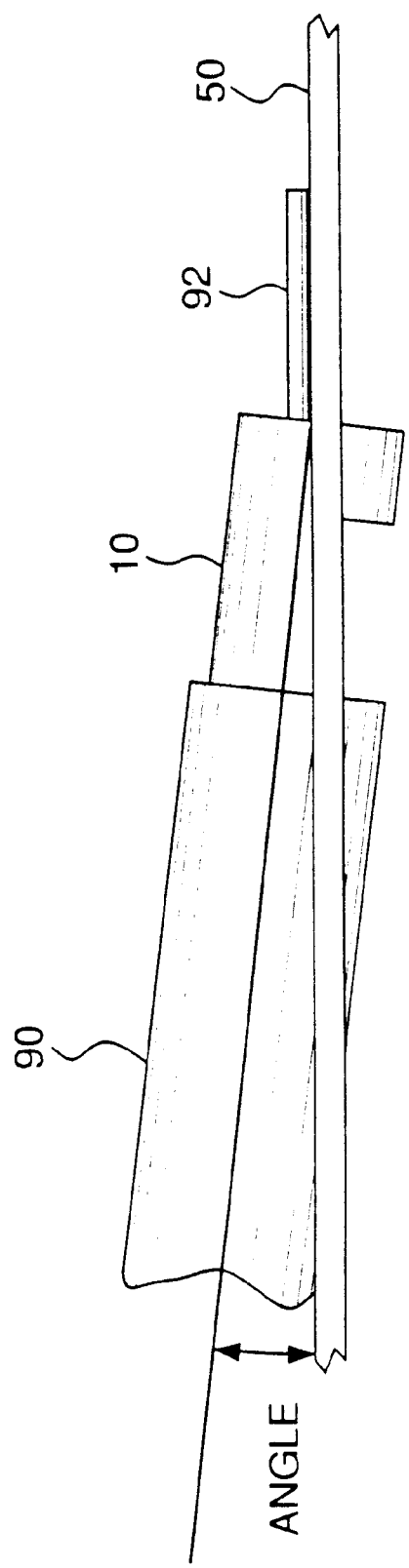
FIG. 4 is a side view of the illustrative apparatus of FIGS. 1 and 2.

As best seen in FIG. 4, which is a side view of apparatus 10, first extension member 16a and second extension member 16b are disposed at an angle of about 15 degrees from the central axis of tube 12. As such, the non-stripped portion of coaxial cable 90 is raised slightly above circuit board 50 and inner conductor 92 is located proximate to circuit board 50. The angle may be from about 5 degrees to about 20 degrees. Further, if apparatus 10 is connected proximate to an end of circuit board 50, the angle may be zero degrees, as described in more detail below.

Referring again to FIG. 1, first extension member 16a comprises an attachment member 18a and an aperture 17a. Attachment member 18a is substantially planar, is tapered at a distal end of attachment member 18a, and extends approximately perpendicular from the surface of first extension member 16a. Attachment member 18a is adapted to be received in a corresponding hole 57a of circuit board 50. While a planar attachment member is shown, other techniques for attaching apparatus 10 to circuit board 50 are contemplated and described below. Aperture 17a allows easy access to solder first extension member 16a to circuit board 50 from the top of circuit board 50; however, aperture 17a is not required to perform soldering, as the soldering can be performed from the bottom of circuit board 50, from the sides of extension members 16a, and the like.

Second extension member 16b comprises an attachment member 18b and an aperture 17b. Attachment member 18b is similar to attachment member 18a.

Circuit board 50 comprises a substrate 51 having a void 60, an electrical signal contact surface 52, a first electrical shield contact surface 56a, and a second electrical shield contact surface 56b.

Figure 2:
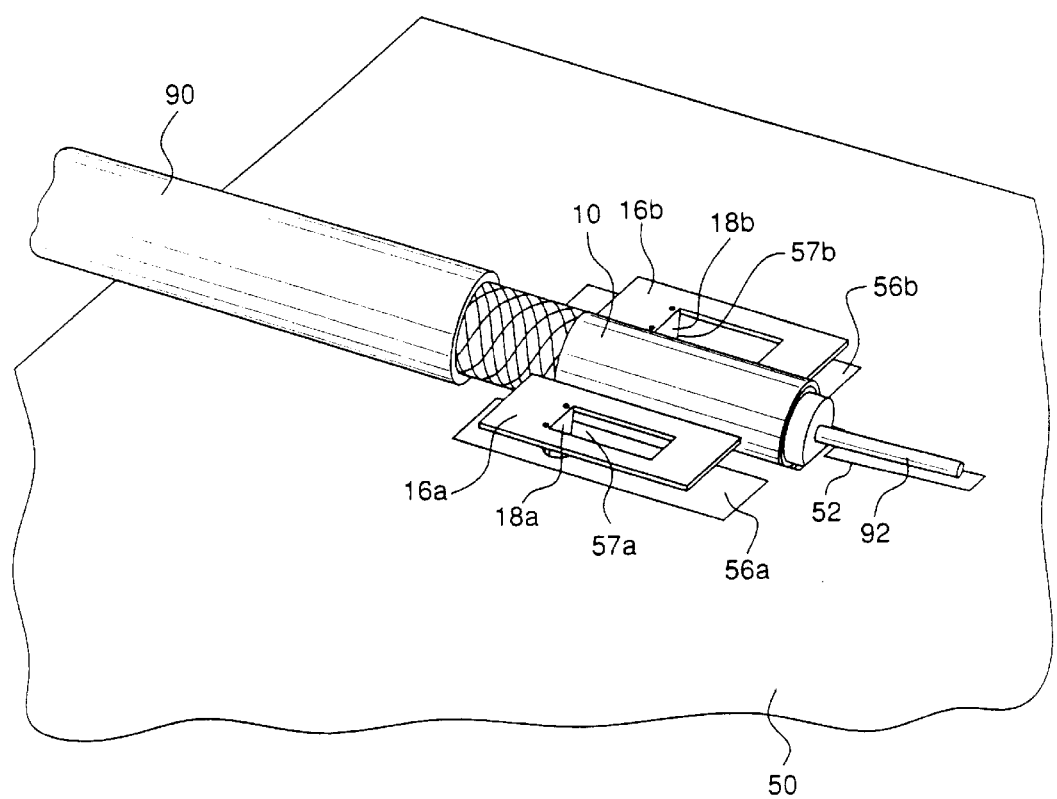
FIG. 2 is a perspective view of the exemplary coaxial cable, the illustrative printed circuit board, and the illustrative apparatus of FIG. 1 shown in a connected state, in accordance with an embodiment of the invention.

As best shown in FIGS. 2 and 4, void 60 is adapted to receive a portion of coaxial cable 90 and a portion of apparatus 10. In this manner, inner conductor 92 may directly contact electrical signal contact surface 52. As such, inner conductor 92 may be connected directly to circuit board 50, for example, by soldering. As shown, void 60 is substantially rectangular, however, void 60 may be any shape to appropriately receive coaxial cable 90 and a portion of apparatus 10. Further, with some placement of apparatus 10 relative to circuit board 50, apparatus 10 does not include void 60, as described in more detail below.

Electrical signal contact surface 52 is substantially rectangular and is located in substrate 51 along a first side of void 60; however, electrical contact surface 52 may be any shape allowing electrical connection between circuit board 50 and apparatus 10. Electrical signal contact surface 52 is adapted to be soldered directly to inner conductor 92, thereby providing a signal interface between coaxial cable 90 and circuit board 50 having one connection point and thus, having relatively reduced return losses.

First electrical shield contact surface 56a is substantially rectangular and is located in substrate 51 along a second side of void 60 and again, may be any appropriate shape. First electrical shield contact surface 56a includes a hole 57a for receiving attachment member 18a. First electrical shield contact surface 56a is adapted to be soldered to attachment member 18a, thereby providing a signal interface between coaxial cable 90 and circuit board 50.

Second electrical shield contact surface 56b is substantially rectangular and is located in substrate 51 along a third side of void 60, opposite the second side of void 60. Second electrical shield contact surface 56b includes a hole 57b for receiving attachment member 18b and is similar to first electrical shield contact surface 56a. While holes 57a and 57b are shown, other connection mechanisms may be employed and are described below.

FIG. 2 is a perspective view of coaxial cable 90, apparatus 10, and circuit board 50 shown in a connected state. As shown in FIG. 2, inner conductor 92 is in contact with electrical signal contact surface 52. First extension member 16a is in contact with first electrical shield contact surface 56a and attachment member 18a is received in hole 57a. Second extension member 16b is in contact with second electrical shield contact surface 56b and attachment member 18b is received in hole 57b. As such, inner conductor 92 may be soldered to electrical signal contact surface 52, first extension member 16a may be soldered to first electrical shield contact surface 56a, and second extension member 16b may be soldered to second electrical shield contact surface 56b.

Figure 5:
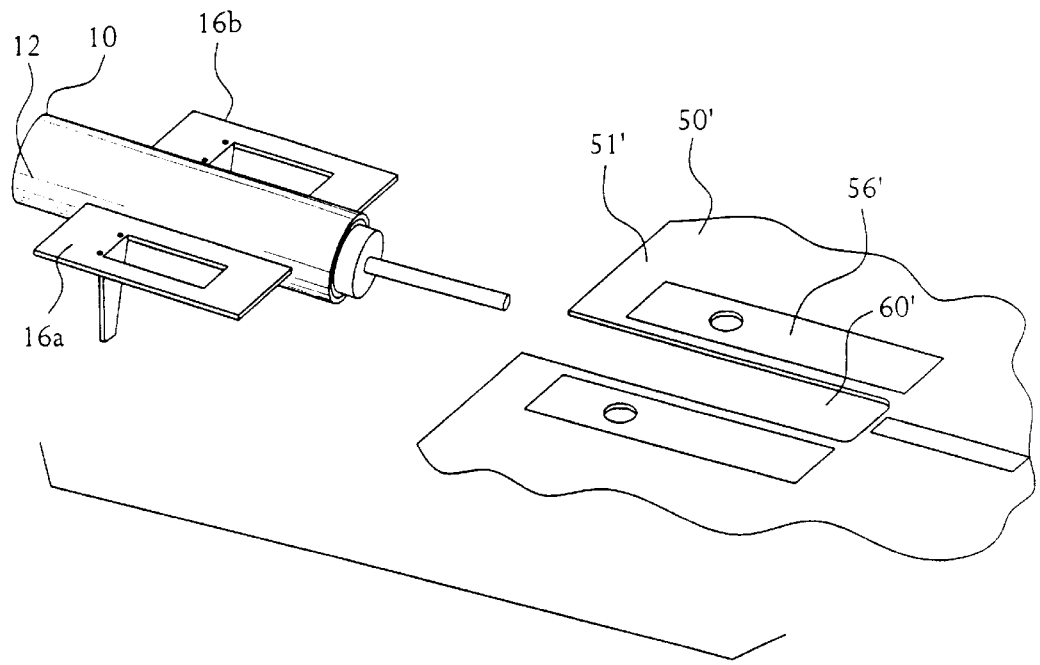
FIG. 5 is a perspective view of yet another illustrative apparatus and circuit board for connecting the coaxial cable to the printed circuit board, in accordance with an embodiment of the invention.
Figure 6:
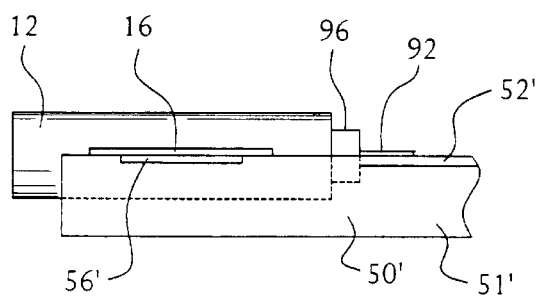
FIG. 6 is a side view of the illustrative apparatus and circuit board of FIG. 5, in accordance with an embodiment of the invention.

FIG. 5 is a perspective view of another illustrative apparatus and circuit board for connecting the coaxial cable to the printed circuit board. As shown in FIG. 5, apparatus 10 is connected proximate to an end of a circuit board 50', wherein the angle between the plane of extension members 16a, 16b and the centerline of tube 12 is about zero. As shown in FIG. 5, a void 60' is located at an end of circuit board 50', such that void 60' is defined on three sides by a substrate 51'. In this embodiment, extension members 16a, 16b are connected to circuit board 50' and are coplanar with circuit board 50', as best seen in FIG. 6.

An electrical signal contact surface 52' is substantially rectangular and is located in substrate 51' along a first side of void 60'; however, electrical contact surface 52' may be any shape allowing electrical connection between circuit board 50' and apparatus 10. Electrical signal contact surface 52' is adapted to be soldered directly to inner conductor 92, thereby providing a signal interface between coaxial cable 90 and circuit board 50' having one connection point and thus, having relatively reduced return losses.

A first electrical shield contact surface 56a' is substantially rectangular and is located in substrate 51' along a second side of void 60' and again, may be any appropriate shape. First electrical shield contact surface 56a' includes a hole 57a' for receiving attachment member 18a. First electrical shield contact surface 56a' is adapted to be soldered to attachment member 18a, thereby providing a signal interface between coaxial cable 90 and circuit board 50'.

A second electrical shield contact surface 56b' is substantially rectangular and is located in substrate 51' along a third side of void 60', opposite the second side of void 60'. Second electrical shield contact surface 56b' includes a hole 57b' for receiving attachment member 18b and is similar to first electrical shield contact surface 56a'. While holes 57a' and 57b' are shown, other connection mechanisms may be employed.

Figure 7:
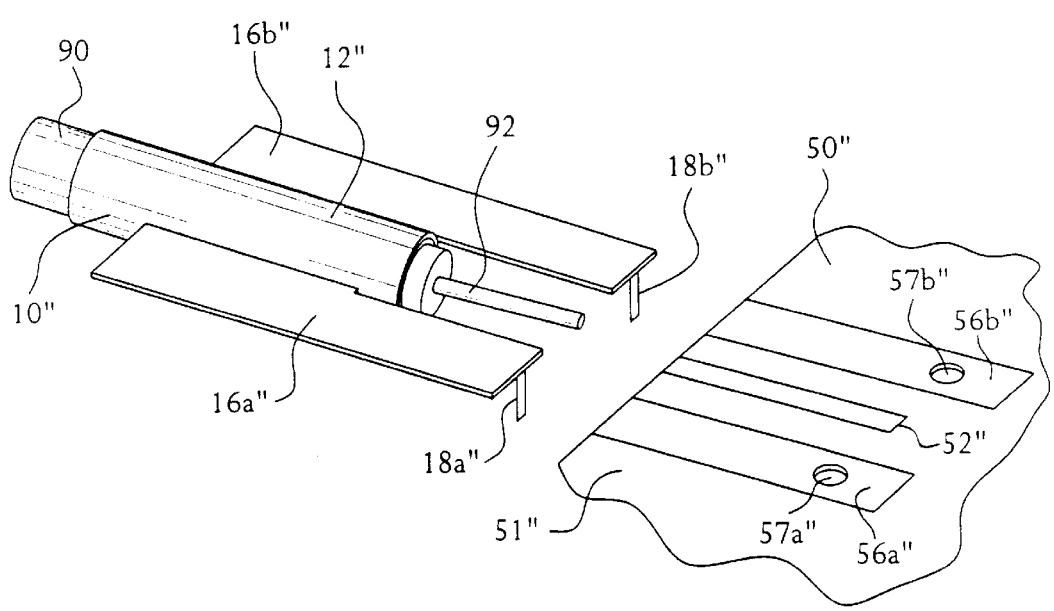
FIG. 7 is a perspective view of another illustrative apparatus and circuit board for connecting the coaxial cable to the printed circuit board, in accordance with an embodiment of the invention.

FIG. 7 is a perspective view of another illustrative apparatus and circuit board for connecting the coaxial cable to the printed circuit board. As shown in FIG. 7, an apparatus 10" is connected proximate to an end of a circuit board 50", wherein circuit board 50" does not include a void for receiving coaxial cable 90. As shown in FIG. 7, an electrical signal contact surface 52", a first electrical shield contact surface 56a", and a second electrical shield contact surface 56b" are each located at an end of circuit board 50". Extension members 16a", 16b" extend longitudinally past an end of tube 12", such that extension members may be connected to circuit board 50".

The connections among the embodiments shown in FIGS. 5 through 9 are as described with respect to the first embodiment described above, as will be understood by persons familiar with general connector technology.

It is to be understood that the foregoing illustrative embodiments have been provided merely for the purpose of explanation and are in no way to be construed as limiting of the invention. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

What is claimed is:

1. An apparatus for connecting a coaxial cable to a circuit board, the apparatus comprising:
   a tube; and
   an extension member connected approximately longitudinally along the tube and extending approximately radially outward from the tube, the extension member comprising a substantially planar surface, the extension member being connected to the tube at a non-zero angle from the central axis of the tube.

2. The apparatus as recited in claim 1 wherein the tube is adapted to receive the coaxial cable.

3. The apparatus as recited in claim 1 wherein the tube comprises a tapered cylinder.

4. The apparatus as recited in claim 1 wherein the tube comprises a metal.

5. The apparatus as recited in claim 1 wherein the extension member is connected to the tube at an angle, of between about 5 degrees and about 20 degrees, from the central axis of the tube.

6. The apparatus as recited in claim 5 wherein the extension member comprises an aperture.

7. The apparatus as recited in claim 5 wherein the extension member comprises an attachment member extending approximately perpendicular to the surface of the extension member.

8. The apparatus as recited in claim 7 wherein the attachment member comprises a substantially planar surface tapered at a distal end of the attachment member.

9. The apparatus as recited in claim 7 wherein the attachment member is adapted to be received in a corresponding hole of the circuit board.

10. The apparatus as recited in claim 1, wherein the extension member comprises a first and second extension member, the first extension member connected approximately longitudinally along the tube and extending approximately radially outward from the tube, the second extension member connected approximately longitudinally along the tube and extending approximately radially outward from the tube, the second extension member being approximately coplanar with the first extension member.

11. The apparatus as recited in claim 1, further comprising:
   a second tube adapted to be located coaxially within the first tube and to be in electrical contact with the first tube.

12. The apparatus as recited in claim 11, wherein the second tube is located coaxially within the first tube.

13. The apparatus as recited in claim 11 wherein the second tube is adapted to receive the coaxial cable.

14. The apparatus as recited in claim 1 wherein the extension member comprises a first and second extension member, the first extension member connected approximately longitudinally along the tube and extending approximately radially outward from the tube, the second extension member connected approximately longitudinally along the tube and extending approximately radially outward from the tube, approximately coplanar with the first extension member;
   the first and second extension members being substantially planar, each extension member comprising an attachment, each attachment member being substantially planar and extending approximately perpendicular to the surface of the extension member.

15. A system for terminating a coaxial cable comprising an inner conductor and an outer conductor, the system comprising:

a connector comprising a tube and an extension member, the tube including a cable-receiving end and an opposing, wire-opening end, the extension member extending substantially outwardly from the tube and connected to the tube at an angle, of between about 5 degrees and about 20 degrees, from the central axis of the tube; and a circuit board comprising a first electrical contact surface and a second electrical contact surface disposed therein, the extension member being in contact with the first electrical contact surface, the second electrical contact surface being disposed substantially longitudinally relative to the tube at the wire opening end;

wherein, when the coaxial cable is received in the connector, the inner conductor of the coaxial cable protrudes from the wire-opening end of the tube and is in direct contact with the first electrical contact surface.

16. The system as recited in claim 15 wherein:

the circuit board comprises a substantially rectangular void;

the second electrical contact surface comprises a hole; and the extension member comprises a substantially planar attachment member extending approximately perpendicular from the extension member, the attachment member adapted to be received in the hole.

17. The system as recited in claim 15 wherein:

the circuit board comprises a female clip electrically and mechanically connected to the second contact surface; and the first extension member comprises a male clip adapted to be received in the female clip.

18. A method for connecting a coaxial cable to a circuit board, the coaxial cable comprising an inner conductor and an outer conductor, the method comprising:

placing an end of the coaxial cable, including the outer conductor, into a tube;

placing the combination of the tube and the end of the coaxial cable into an attachment mechanism;

connecting the attachment mechanism to the circuit board; and connecting the inner conductor directly to the circuit board.

19. The method as recited in claim 18, wherein connecting the attachment mechanism to the circuit board comprises soldering the attachment mechanism to the circuit board.

20. The method as recited in claim 18, wherein connecting the inner conductor directly to the circuit board comprises soldering the inner conductor directly to the circuit board.

21. The method as recited in claim 18 further comprising:

stripping an insulation from the coaxial cable to expose the inner conductor and the outer conductor of the coaxial cable prior to placing the end of the coaxial cable into the tube.

22. An apparatus for connecting a coaxial cable to a circuit board, the apparatus comprising:

a tube; and an extension member connected approximately longitudinally along the tube and extending approximately radially outward from the tube, the extension member comprising a substantially planar surface, the extension member comprising an attachment member extending approximately perpendicular to the surface of the extension member, the attachment member comprising a substantially planar surface tapered at a distal end of the attachment member.

23. The apparatus as recited in claim 22 wherein the attachment member is adapted to be received in a corresponding hole of the circuit board.

24. The apparatus as recited in claim 22 wherein a substantially central portion of the extension member extends perpendicular to the surface of the remainder of the extension member, thereby forming the attachment member.

25. An apparatus for connecting a coaxial cable to a circuit board, the apparatus comprising:

a first tube adapted to coaxially receive an end of a coaxial cable having an exposed outer conductor, thereby providing hoop strength to the end of the coaxial cable; and an attachment mechanism comprising:

a second tube adapted to coaxially receive the first tube; and an extension member connected approximately longitudinally along the second tube and extending approximately radially outward from the second tube.

26. The apparatus as recited in claim 25, wherein the first tube is located coaxially within the second tube.

* * * * *